(12) United States Patent
Yokoyama et al.

(10) Patent No.: US 7,459,794 B2
(45) Date of Patent: Dec. 2, 2008

(54) SUBSTRATE FOR DEVICE BONDING, DEVICE BONDED SUBSTRATE, AND METHOD FOR PRODUCING SAME

(75) Inventors: Hiroki Yokoyama, Shunan (JP); Yasuko Takeda, Shunan (JP); Reo Yamamoto, Shunan (JP)

(73) Assignee: Tokuyama Corporation (JP)

( * ) Notice: Subject to any disclaimer, the term of this patent is extended or adjusted under 35 U.S.C. 154(b) by 179 days.

(21) Appl. No.: 10/569,358

(22) PCT Filed: Aug. 17, 2004

(86) PCT No.: PCT/JP2004/011775

§ 371 (c)(1),
(2), (4) Date: Feb. 24, 2006

(87) PCT Pub. No.: WO2005/020315

PCT Pub. Date: Mar. 3, 2005

(65) Prior Publication Data

US 2007/0001315 A1    Jan. 4, 2007

(30) Foreign Application Priority Data

Aug. 26, 2003 (JP) ............................. 2003-208783
Jan. 19, 2004 (JP) ............................. 2004-010700

(51) Int. Cl.
*H01L 23/48* (2006.01)
(52) U.S. Cl. ...................................... 257/779
(58) Field of Classification Search .................. 257/772, 257/781, 779–780
See application file for complete search history.

(56) References Cited

U.S. PATENT DOCUMENTS 5,106,009 A * 4/1992 Humpston et al. .......... 228/195

(Continued)

FOREIGN PATENT DOCUMENTS

DE        100 03 665 A1    8/2000

(Continued)

OTHER PUBLICATIONS

Abtew, Mulugeta et al., "Lead-Free Solders in Microelectronics", *Materials Science and Engineering*, Reports: A Review Journal, 27 (2000), pp. 95-141.

*Primary Examiner*—Nathan W Ha
(74) *Attorney, Agent, or Firm*—The Webb Law Firm, P.C

(57) ABSTRACT

A substrate for device bonding includes a substrate having an electrode layer and a solder layer formed on the electrode layer, wherein the solder layer is a Pb-free solder layer which comprises (1) a base metal composed of (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, and the solder layer has a thickness of 1 to 15 μm and a surface roughness (Ra) of not more than 0.11 μm.

6 Claims, 6 Drawing Sheets

U.S. PATENT DOCUMENTS

| | | |
|---|---|---|
| 5,455,004 A | 10/1995 | Slattery et al. |
| 5,679,469 A | 10/1997 | Shimoda et al. |
| 5,990,560 A * | 11/1999 | Coult et al. ................. 257/772 |
| 6,193,139 B1 * | 2/2001 | Kivilahti ................ 228/180.21 |
| 6,365,097 B1 | 4/2002 | Yamashita et al. |
| 6,596,621 B1 * | 7/2003 | Copeland et al. ............ 438/614 |
| 7,015,538 B2 | 3/2006 | Yoshino et al. |
| 7,023,089 B1 * | 4/2006 | Lu ............................ 257/751 |
| 7,196,356 B2 * | 3/2007 | Ishii et al. .................... 257/81 |
| 7,235,309 B2 * | 6/2007 | Ogawa ....................... 428/647 |
| 2002/0047217 A1 * | 4/2002 | Zakel et al. ................. 257/781 |
| 2004/0084509 A1 * | 5/2004 | Meyer et al. ................ 228/194 |
| 2004/0155358 A1 * | 8/2004 | Iijima ......................... 257/778 |
| 2005/0269385 A1 * | 12/2005 | Chen et al. ............. 228/180.22 |

FOREIGN PATENT DOCUMENTS

| | | |
|---|---|---|
| EP | 0 695 732 A2 | 2/1996 |
| JP | 5-186884 A | 7/1993 |
| JP | 7-155984 A | 6/1995 |
| JP | 2000-277909 A | 10/2000 |
| JP | 2002-178191 A | 6/2002 |
| JP | 2002-368020 A | 12/2002 |
| JP | 2002-373960 A | 12/2002 |
| JP | 2003-060354 A | 2/2003 |
| JP | 2003-200288 A | 7/2003 |
| WO | WO 97/43456 A1 | 11/1997 |
| WO | WO 02/40213 A1 | 5/2002 |

* cited by examiner

SUBSTRATE FOR DEVICE BONDING, DEVICE BONDED SUBSTRATE, AND METHOD FOR PRODUCING SAME

TECHNICAL FIELD

The present invention relates to a substrate for device bonding which is used for bonding or fixing devices, a device bonded substrate in which a device has been bonded to the substrate for device bonding, and a process for producing the substrate for device bonding.

BACKGROUND ART

With the spread of cellular phones and optical communications, ceramic substrates have been employed as substrates for mounting semiconductor devices of high output and high power consumption which work in the high-frequency region, such as GaAs type FET, Si—Ge type HBT, Si type MOSFET and GaN type laser diode, for the reason of low dielectric loss at high frequencies. Of the ceramic substrates, aluminum nitride sintered substrates are particularly paid attention because they have excellent characteristics that the thermal conductivity is high and the coefficient of thermal expansion is close to that of semiconductor devices.

For bonding a device onto a ceramic substrate such as an aluminum nitride sintered product, it is general that a first and a second undercoating metal layers firmly bonded to the ceramic substrate are formed by metallization, then on the undercoating metal layer an electrode layer composed of a noble metal such as gold is formed, and the device is soldered to the electrode layer. For soldering the device, a reflow process is frequently adopted from the viewpoint of efficiency. Therefore, a solder layer of a specific pattern for bonding the device needs to be previously formed on the electrode layer of the substrate.

As the semiconductor devices are integrated more highly in recent years, the solder layer needs to be formed in an extremely small area on the substrate for the reflow process with higher precision using thin film-forming technique. The solder layer is generally formed by laminating various metal thin film layers successively in such a manner that a prescribed solder composition should be obtained when the solder layer is molten. Such a solder layer is referred to as a "thin film-laminated solder layer" hereinafter, and a ceramic substrate having an electrode layer on which the thin film-laminated solder layer has been formed is referred to as a "ceramic substrate with a thin film-laminated solder layer" hereinafter.

As such a ceramic substrate with a thin film-laminated solder layer, there is known a substrate having an Au—Sn type thin film-laminated solder layer (see patent document 1), a substrate having a thin film-laminated solder layer that gives a Sn-37 wt % Pb eutectic solder having a melting point of 183° C. or gives a solder containing this eutectic solder and a small amount of a different metal (these solders being also referred to as "Sn—Pb eutectic solders" generically hereinafter) in the melting stage (see patent document 2), or the like. The Sn—Pb eutectic solders are most popular as electronically industrial solders and have widely spread, and they can bond devices with high bond strength even in case of a thin film-laminated solder layer (e.g., solder layer shown in FIG. 12 in which a Pb layer and a Sn layer are laminated alternately).

On the other hand, so-called Pb-free solders containing no lead component have been employed recently because harmfulness of lead has become a problem. As the Pb-free solders, those having a melting point equivalent to that of the Sn—Pb eutectic solvers are desired from the viewpoint of substitutes for the Sn—Pb eutectic solders, and as such Pb-free solders, a Sn—Zn—In type solder (see patent document 3) and a Su—Ag—Bi type solder (see patent document 4) are known. These solders, however, are alloy solders previously prepared so as to have a prescribed composition, and any example of the thin film-laminated solder layer using such Pb-free solders is not known. In the present specification, the solder layer composed of an alloy solder previously prepared so as to have a prescribed composition is called an "alloy solder layer" for convenience and distinguished from the aforesaid thin film-laminated solder layer.

Pertinent background art includes the following Japanese patent documents:

Patent document 1: Japanese Patent Laid-Open Publication No. 373960/2002;

Patent document 2: Japanese Patent Laid-Open Publication No. 186884/1993;

Patent document 3: Japanese Patent Laid-Open Publication No. 155984/1995; and

Patent document 4: Japanese Patent Laid-Open Publication No. 200288/2003.

In the case of a ceramic substrate with a thin film-laminated solder layer, Pb-freeing is an important technical problem, and it has been heretofore been desired to convert a thin film-laminated solder layer that gives a Sn—Pb solder in the melting stage into a Pb-free thin film-laminated solder layer.

In the case of the thin film-laminated solder layer, however, the whole layer gives a prescribed solder composition when the layers are molten, so that its performance is greatly influenced by the layer structure differently from an alloy solder layer (this is apparent also from the later-described comparison between the examples and the comparative examples). For example, even if high bond strength is obtained by the alloy solder layer, sufficient bond strength is not obtained frequently by the thin film-laminated solder layer that is formed so as to give the same composition as that of the alloy solder layer in the melting stage. Further, the process to bond a device to a ceramic substrate having a Sn—Pb eutectic thin film-laminated solder layer has been established, and therefore, in the shift to the Pb-free thin film-laminated solder layer from the Sn—Pb eutectic thin film-laminated solder layer, it is required that bond strength equivalent to that obtained by the Sn—Pb eutectic thin film-laminated solder layer should be obtained, and besides there is no large modification of the process. In order to satisfy these requirements, the Pb-free thin film-laminated solder layer adopted needs to have a melting point of 170 to 230° C. preferably 180 to 200° C.

It is an object of the present invention to provide a substrate for device bonding which has a Pb-free thin film-laminated solder layer satisfying the above requirements.

SUMMARY OF THE INVENTION

In order to solve the above problem, the present inventors have have found that by the addition of metals such as Bi and In to a Pb-free solder such as a Sn type solder containing Au, the resulting solder can have a melting point almost equivalent to that of a Sn—Pb eutectic solder. However, it has been also found that there is a problem of low bond strength in the case where a device is soldered by the use of such thin film-laminated solder layer incorporated with the above metals. In order to solve this problem, the present inventors have further found that high bond strength is sometimes obtained by adding specific metals such as Ag, bond strength is strongly influenced by the surface roughness of the thin film-laminated solder layer surface, and when the surface roughness is lower than a specific value, high bond strength is obtained. Furthermore, the present inventors have succeeded in finding a method for stably forming a solder layer having a surface roughness satisfying this condition. Based on the finding, the present invention has been accomplished.

That is to say, the subject matter of the present invention is as follows.

[1] A substrate for device bonding, comprising a substrate having an electrode layer and a solder layer formed on the electrode layer, wherein the solder layer is a Pb-free solder layer comprising:

(1) a base metal comprising (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, and the solder layer has a thickness of 1 to 15 µm and a surface roughness (Ra) of not more than 0.11 µm.

[2] The substrate for device bonding as stated in [1], wherein the solder layer comprises:

(1) a base metal layer comprising (i) Sn, (ii) Sn and Au, or (iii) In, (2) one or more melting point-lowering metal layers each of which comprises at least one metal selected from the group consisting of Bi, In (only in the case where the base metal is Sn, or Sn and Au), Zn, Au (only in the case where the base metal is In) and Sb, and (3) one or more surface-smoothing metal layers each of which comprises at least one metal selected from the group consisting of Ag, Ni, Fe, Al, Cu and Pt, and each of the melting point-lowering metal layers is adjacent to any one of the surface-smoothing metal layers.

[3] A process for producing the substrate for device bonding as stated in [1] or [2], comprising a solder layer-forming step for forming a Pb-free solder layer on an electrode layer of a substrate having an electrode layer, said Pb-free solder layer comprising:

(1) a base metal comprising (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, said Pb-free solder layer having a thickness of 1 to 15 µm and a surface roughness (Ra) of not more than 0.11 µm, wherein the solder layer-forming step includes one or more steps for forming a layer comprising the base metal, one or more steps for forming a melting point-lowering metal layer comprising at least one metal selected from the group consisting of Bi, In (only in the case where the base metal is Sn, or Sn and Au), Zn, Au (only in the case where the base metal is In) and Sb, and one or more steps for forming a surface-smoothing metal layer comprising at least one metal selected from the group consisting of Ag, Ni, Fe, Al, Cu and Pt, and immediately before and/or immediately after the step for forming the melting point-lowering metal layer, any one of the steps for forming the surface-smoothing metal layer is carried out.

[4] A process for producing the substrate for device bonding as stated in [1] or [2], comprising a bonding layer-forming step for forming a bonding layer comprising a transition metal on an electrode layer of a substrate having an electrode layer and a solder layer-forming step for forming a Pb-free solder layer on the bonding layer, said Pb-free solder layer comprising:

(1) a base metal comprising (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, said Pb-free solder layer having a thickness of 1 to 15 µm and a surface roughness (Ra) of not more than 0.11 µm, wherein the solder layer-forming step includes one or more steps for forming a layer comprising the base metal, one or more steps for forming a melting point-lowering metal layer comprising at least one metal selected from the group consisting of Bi, In (only in the case where the base metal is Sn, or Sn and Au), Zn, Au (only in the case where the base metal is In) and Sb, and one or more steps for forming a surface-smoothing metal layer comprising at least one metal selected from the group consisting of Ag, Ni, Fe, Al, Cu and Pt, and immediately before and/or immediately after the step for forming the melting point-lowering metal layer, any one of the steps for forming the surface-smoothing metal layer is carried out.

[5] A process for producing a device bonded substrate, comprising placing a device having an electrode on the solder layer of the substrate for device bonding as stated in [1] or [2] in such a manner that the electrode of the device is brought into contact with the solder layer and then bonding the device by reflow soldering.

[6] A device bonded substrate produced by the process as stated in [5].

According to the substrate for device bonding of the invention, it becomes possible to bond semiconductor devices without using a Sn—Pb eutectic solder that is considered to have a fear of harmfulness. Further, since the solder used in the substrate for device bonding of the invention has a melting point of almost the same level as that of a Sn—Pb eutectic solder, a conventional reflow process using a Sn—Pb eutectic solder can be adopted without largely modifying the process, and it becomes possible to solder semiconductor devices with high bond strength at low temperatures. In particular, a ceramic substrate which contains aluminum nitride as a main component on which an electrode layer has been formed is very excellent substrate for device bonding, which has, in addition to the above merits, both of a merit of low dielectric loss at high frequencies and a merit of excellent heat discharging properties to dissipate heat that is generated when the device is used.

According to the production process of the invention, it is possible to efficiently produce the above-mentioned excellent substrate for device bonding.

DETAILED DESCRIPTION OF THE INVENTION

Figure 1:
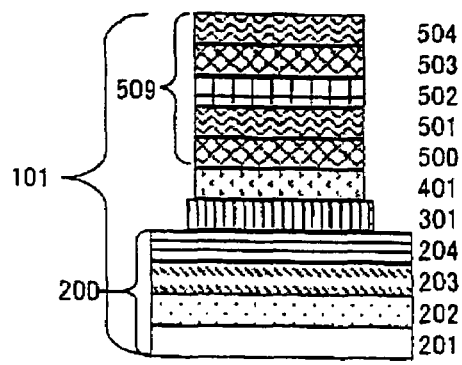
FIG. 1 is a sectional view of a substrate for device bonding of the present invention used in Example 1.

The substrate for device bonding of the invention comprises a substrate having an electrode layer and a solder layer formed on the electrode layer, wherein the solder layer is a Pb-free solder layer comprising (1) a base metal composed of (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, and the solder layer has a thickness of 1 to 15 μm and a surface roughness (Ra) of not more than 0.11 μm.

The "substrate having an electrode layer" in the invention is not specifically restricted so long as being a substrate on a part or all of a surface of which an electrode layer composed of a noble metal functioning as an electrode has been formed, but from the viewpoint that dielectric loss at high frequencies is low when a semiconductor device bonded to the substrate is used, it is preferable to use a metallized substrate obtained by forming a noble metal layer on a ceramic substrate such as aluminum nitride, alumina or SiC, or a Si substrate, particularly a ceramic substrate having a surface roughness Ra of not more than 0.05 μm and Rmax of not more than 0.2 μm, by means of metallization. Although Au, Ag, Pd, Pt or the like is employable as the noble metal to constitute the electrode layer, Au having extremely low conduction resistance is preferably employed.

In the metallized substrate, the noble metal electrode layer is generally formed directly or indirectly on an undercoating metal layer that is firmly bonded to the ceramic substrate, as previously described. In case of, for example, an alumina substrate, there can be preferably employed a metallized substrate obtained by printing an electrode pattern composed of a paste of a high-melting point metal such as tungsten or molybdenum on an alumina green sheet, sintering the pattern and the green sheet simultaneously, then forming a nickel layer on the high-melting point metal layer if necessary, and further forming thereon a noble metal layer such as a gold layer. In case of a ceramic substrate containing aluminum nitride as a main component, there can be particularly preferably employed a metallized substrate obtained by (i) a process comprising adding a sintering agent to an aluminum nitride powder, molding the mixture to thereby sintering the same, then forming a metal layer (first undercoating layer) containing titanium as a main component and having basically the same shape as that of the electrode pattern on a surface of the sintered substrate by sputtering or the like and then forming, as an electrode layer, a layer containing platinum as a main component on the first undercoating layer by sputtering or the like similarly to the above, or a metallized substrate obtained by (ii) a process comprising further forming an electrode layer of gold or the like on the platinum layer as the second undercoating layer by sputtering or the like. In the substrate for device bonding of the invention, it is particularly preferable to use the aluminum nitride type metallized substrate obtained by the above process (i) or (ii) from the viewpoint that heat discharging properties to dissipate heat that is generated when a device bonded thereto is used are excellent.

In the present invention, the thickness of the solder layer is in the range of 1 to 15 μm, and from the viewpoints of precision bonding of a device and bond strength, the thickness is in the range of preferably 2 to 8 μm. If the thickness of the solder layer is less than 1 μm, sufficient bond strength is not obtained occasionally. If the thickness thereof exceeds 15 μm, a trouble that a side surface or an upper surface (light emission surface in case of semiconductor device) of the device is obscured by the solder after bonding sometimes takes place because the amount of the solder is too large.

In the present invention, the surface roughness (Ra) of the solder layer is not more than 0.11 μm, preferably not more than 0.06 μm, particularly preferably not more than 0.05 μm. When the surface roughness (Ra) of the solder layer is in this range, high bond strength is obtained when a device is soldered. If the surface roughness exceeds 0.11 μm, high bond strength is not obtained in some cases. The bond strength is sensitive also to the surface profile of the solder layer, and therefore, in addition to the Ra of the above range, Rmax is preferably not more than 0.90 μm, more preferably not more than 0.55 μm.

The term "surface roughness (Ra)" used herein is an arithmetic mean value of surface protrusions and depressions based on the center plane of the measuring region, and is one parameter obtained by numerically expressing shapes and sizes of protrusions and depressions of the surface. The term "Rmax" is a difference in height between the highest point and the lowest point of the surface.

In the present invention, measurements of the surface roughness (Ra) and the Rmax are carried out using AFM (atomic force microscope). The AFM can three-dimensionally measure fine surface profile of a sample by resolution of atomic level (A order), and by image processing of the resulting three-dimensional profile, accurate surface roughness (Ra) and Rmax can be determined.

The base metal is an essential component of a solder, and is a component to primarily determine the melting point of the solder and to make basic bond strength appear. As the base metal, (i) Sn, (ii) Sn and Au, or (iii) In is employable, and for the reason of high reliability after bonding, it is preferable to use (i) Sn or (ii) Sn and Au.

The content of the base metal in the solder layer is in the range of preferably 10 to 95% by weight, particularly preferably 34 to 90% by weight, based on the total weight of the solder layer. In the case where (ii) Sn and Au are used as the base metals, it is preferable that the content of Sn is in the range of 80 to 99% by weight and the content of Au is in the range of 1 to 20% by weight, based on the total weight of the base metals, and from the viewpoint of bond strength, it is most preferable that the content of Sn is in the range of 87 to 97% by weight and the content of Au is in the range of 3 to 13% by weight, based on the total weight of the base metals.

The melting point-lowering metal has a function of lowering a melting point of the solder layer. The melting point-lowering metal is at least one metal selected from the group consisting of Bi, In, Zn, Au and Sb. However, use of In as the melting point-lowering metal is restricted to the case where the base metal is Sn, or Sn and Au, and use of Au as the melting point-lowering metal is restricted to the case where the base metal is In. For the reason that the melting point lowering effect on all the base metals is high, Bi is preferably used as the melting point-lowering metal. In the case where the base metal is Sn, or Sn and Au, In can also be preferably used as well as Bi, for the same reason. The In has not only a melting point lowering effect but also has an advantage that cushioning effect at the bonding is high because In itself is soft.

The content of the melting point-lowering metal is in the range of preferably 0.1 to 30% by weight, particularly preferably 3 to 16% by weight, based on the total weight of the solder layer, from the viewpoints of a melting point and bond strength of the solder layer. When the content of the melting point-lowering metal is in this range, the melting point of the solder layer can be made to be in the range of 170 to 230° C., preferably 180 to 200° C. If the content of the melting point-lowering metal is low, the melting point of the solder layer tends to be raised. If the content thereof is less than the lower limit of the above range, the melting point of the solder layer frequently exceeds 230° C.

The surface-smoothing metal has a function of smoothing a surface of the solder layer. It is preferable to use Ag as the surface smoothing metal because Ag has a high surface smoothing effect and also has a melting point lowering effect.

The content of the surface-smoothing metal is in the range of preferably 4.9 to 60% by weight, particularly preferably 7 to 50% by weight, based on the total weight of the solder layer, from the viewpoint of the surface smoothing effect.

In the solder layer, components, such as Ga, Pd, P, Mn, Cr, Ti and rare earth elements, may be contained when needed, with the proviso that the content of these components is less than 20% by weight, preferably less than 10% by weight, based on the total weight of the solder layer.

In case of the substrate for device bonding of the invention having a solder layer of the above properties, it is possible to carry out soldering of device with high bond strength in the temperature range of 170 to 230° C., and a conventional reflow process for Sn—Pb eutectic solders can be adopted without modifying the process largely.

In the present invention, the existence form of the various components contained in the solder layer is not specifically restricted. That is to say, the solder layer may be, for example, the aforesaid thin film-laminated solder layer or an alloy solder layer, but because a fine pattern can be formed with high precision, the solder layer is preferably the thin film-laminated solder layer. There is no specific limitation on the method for forming the thin film-laminated solder layer, and for example, sputtering, ion plating, deposition, CVD method and plating are preferable.

In the case where the solder layer in the invention is a thin film-laminated solder layer, it is preferable that the solder layer comprises (1) a base metal layer composed of (i) Sn, (ii) Sn and Au, or (iii) In, (2) one or more melting point-lowering metal layers each of which is composed of at least one metal selected from the group consisting of Bi, In (only in the case where the base metal is Sn, or Sn and Au), Zn, Au (only in the case where the base metal is In) and Sb, and (3) one or more surface-smoothing metal layers each of which is composed of at least one metal selected from the group consisting of Ag, Ni, Fe, Al, Cu and Pt, and each of the melting point-lowering metal layers is adjacent to any one of the surface-smoothing metal layers. When the base metal layer is composed of Sn and Au, the base metal layer may have such a single layer structure of homogeneous composition as is formed by depositing Sn and Au simultaneously, or may have a multi-layer structure including one or more Sn layers and one or more Au layers. Further, the aforesaid arbitrary components, such as Ga, Pd, P, Mn, Cr, Ti and rare earth elements, can be introduced at the formation of the base metal layer.

As the layer structure wherein the melting point-lowering metal layer is adjacent to the surface-smoothing metal layer, there can be mentioned three kinds of layer structures, i.e., a layer structure wherein the surface-smoothing metal layer is present on the melting point-lowering metal layer, a layer structure wherein the surface-smoothing metal layer is present under the melting point-lowering metal layer, and a layer structure wherein the surface-smoothing metal layers are present on and under the melting point-lowering metal layer.

In case of the layer structure wherein the surface-smoothing metal layer is present on the melting point-lowering metal layer, the melting point-lowering metal layer is formed on a layer (e.g., layer of Pb-free solder) other than the surface-smoothing metal layer at the formation of the thin film-laminated solder layer. In this case, the melting point-lowering metal is partially aggregated, so that the resulting melting point-lowering metal layer is not a smooth continuous layer and has a rough surface. However, when a surface-smoothing metal layer is further formed thereon, the rough surface is restored presumably by the interaction between the melting point-lowering metal and the surface-smoothing metal, whereby a smooth surface is provided.

In case of the layer structure wherein the surface-smoothing metal layer is present under the melting point-lowering metal layer, the melting point-lowering metal layer is formed on the surface-smoothing metal layer at the formation of the thin film-laminated solder layer. The resulting melting point-lowering metal layer is a smooth continuous layer though aggregation slightly occurs.

In case of the layer structure wherein the surface-smoothing metal layers are present on and under the melting point-lowering metal layer, aggregation of the melting point-lowering metal most hardly occurs at the formation of the thin film-laminated solder layer, and the resulting melting point-lowering metal layer is a continuous layer of high smoothness.

As described above, if the melting point-lowering metal layer is adjacent to the surface-smoothing metal layer in the solder layer, the melting point-lowering metal layer becomes a continuous layer of smooth surface, and even if the melting point-lowering metal is temporarily aggregated to form a discontinuous layer, this layer is restored by the surface-smoothing metal layer laminated thereon and has a smooth surface. Therefore, the solder layer finally obtained has high surface smoothness and exhibits great bonding power when a device is bonded. Of the above layer structures, the layer structure wherein the surface-smoothing metal layer is present on and under the melting point-lowering metal layer is particularly preferable because a solder layer having highest smoothness and greatest bonding ability is obtained.

On the other hand, in the case where the melting point-lowering metal layer is not adjacent to any surface-smoothing metal layer, the melting point-lowering metal layer is aggregated at the formation of the thin film-laminated solder layer and is not restored, so that the finally obtained solder layer has low surface smoothness, and when a device is bonded, sufficient bonding ability is not obtained in some cases. As a result, soldering in the temperature range of 170 to 230° C. with high bond strength sometimes becomes feasible.

In the substrate for device bonding of the invention, between the electrode layer and the solder layer, a layer composed of a noble metal (e.g., Pt) other than the noble metal for forming the electrode layer and a bonding layer (e.g., Ti layer) may be present in this order from the electrode layer side.

Next, preferred embodiments of the solder layers having the aforesaid specific layer structures are described in detail referring to the attached drawings.

Figure 2:
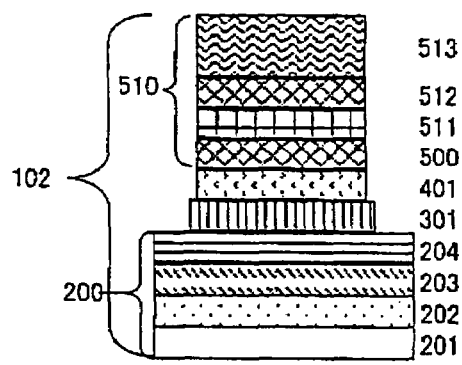
FIG. 2 is a sectional view of a substrate for device bonding of the present invention used in Example 2.
Figure 3:
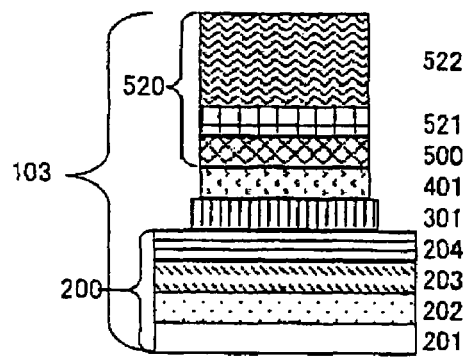
FIG. 3 is a sectional view of a substrate for device bonding of the present invention used in Example 3.

For example, such a layer structure as is shown in FIG. 1 wherein a surface-smoothing metal layer 500, a gold-tin alloy (also referred to as "Au10—Sn") layer 501 having a gold content of 10% by weight as a base metal layer, a melting point-lowering metal layer 502 such as a Bi layer, a surface-smoothing metal layer 503 and an Au10—Sn layer 504 are laminated in this order; such a layer structure as is shown in FIG. 2 wherein a surface-smoothing metal layer 500, a melting point-lowering metal layer 511, a surface-smoothing metal layer 512 and an Au10—Sn layer 513 are laminated in this order; and such a layer structure as is shown in FIG. 3 wherein a surface-smoothing metal layer 500, a melting point-lowering metal layer 521 and an Au10—Sn layer 522 are laminated in this order are preferable.

In the above embodiments, the thickness of each layer is properly determined taking the whole composition into consideration. In the embodiment shown in FIG. 1, the thickness of the Au10—Sn layer 501 located at the nearer side to the substrate is preferably $1/32$ to $1/2$ of the thickness of the Au10—Sn layer 504 located at the farther side from the substrate.

The thickness of the surface-smoothing metal layer 500 present as the lowest layer in the solder layer is in the range of preferably 0.1 to 5 μm, particularly preferably 0.2 to 3 μm, from the viewpoint of cost performance. If the thickness of this layer is less than 0.1 μm, the surface smoothing effect is low. Even if the thickness is more than 5 μm, the surface smoothing effect is almost the same as that of a layer having a thickness of 0.2 to 3 μm. This surface-smoothing metal layer is preferably composed of Ag.

There is no specific limitation on the process for producing the substrate for device bonding of the invention. For example, the substrate for device bonding can be obtained by forming a solder layer of the aforesaid composition on an electrode layer of a substrate having an electrode layer and then polishing the surface of the solder layer so that the thickness and the surface roughness of the solder layer should satisfy the aforesaid requirements. However, for the reason that the substrate for device bonding can be simply and readily obtained in high yields with high reproducibility, it is preferable to adopt the following process (process of the invention). That is to say, it is preferable to adopt a process for producing a substrate for device bonding, comprising a solder layer-forming step for forming a Pb-free solder layer on an electrode layer of a substrate having an electrode layer, said Pb-free solder layer comprising (1) a base metal composed of (i) Sn, (ii) Sn and Au, or (iii) In, (2) at least one metal selected from the group consisting of Bi, In (only in the case where the base metal is Sn, or Sn and Au), Zn, Au (only in the case where the base metal is In) and Sb, and (3) at least one metal selected from the group consisting of Ag, Ni, Fe, Al, Cu and Pt, and said Pb-free solder layer having a thickness of 1 to 15 μm and a surface roughness (Ra) of not more than 0.11 μm, wherein the solder layer-forming step includes one or more steps for forming a layer composed of the base metal, one or more steps for forming a melting point-lowering metal layer composed of at least one metal selected from the group consisting of Bi, In (only in the case where the base metal is Sn, or Sn and Au), Zn, Au (only in the case where the base metal is In) and Sb, and one or more steps for forming a surface-smoothing metal layer composed of at least one metal selected from the group consisting of Ag, Ni, Fe, Al, Cu and Pt, and immediately before and/or immediately after the step for forming the melting point-lowering metal layer, any one of the steps for forming the surface-smoothing metal layer is carried out.

In the above production process, the solder layer does not necessarily have to be formed directly on the electrode layer of the substrate having an electrode layer, and it is possible that a bonding layer composed of a transition metal is formed on the electrode layer of the substrate having an electrode layer and then the solder layer is formed on the bonding layer.

There is no specific limitation on the method to bond a device such as a semiconductor device to the substrate for device bonding of the invention, and soldering methods publicly known are adoptable without any restriction. For the reason that bonding of high precision can be efficiently carried out, it is preferable that a device having an electrode is placed on the solder layer of the substrate for device bonding of the invention in such a manner that the electrode of the device is brought into contact with the solder layer and then the device is bonded by reflow soldering. The reflow soldering is a process comprising supplying a solder to a prescribed land of a substrate or an electrode of a part or both of them, fixing the part at a given position of the substrate, and then melting the solder (allowing the solder to flow) to bond the part and the substrate to each other. In this process, a method for allowing the solder to reflow is not specifically restricted, and a method using a reflow conveyer, a method using a hot plate, vapor reflowing, etc. are adoptable. The heating temperature and the heating time are properly determined according to the type of the solder used. In the case where the substrate for device bonding of the invention is used, excellent soldering can be carried out at almost the same temperature as that for bonding a device to a ceramic substrate having a solder pattern of a Sn—Pb eutectic thin film-laminated structure, specifically 170 to 230° C., preferably 180 to 200° C.

As the "device" to be bonded by soldering, a device having an electrode composed of a metal capable of being bonded with a solder is employed. Examples of such devices include electrical parts, such as resistors and capacitors, and semiconductor devices having electrodes capable of being directly connected to other electrical wirings. In the devices generally used in the semiconductor field, the electrodes are usually composed of gold, but the electrode employable in the invention is not limited thereto.

In the case where the lowest layer in the solder layer is a surface-smoothing metal layer, if the solder layer is heated and molten by the above-mentioned device bonding method, the surface-smoothing metal diffuses into the whole of the molten solder layer. In this case, all of the surface-smoothing metal that constitutes the surface-smoothing metal layer does not necessarily diffuse, and the surface-smoothing metal sometimes remains in the form of a layer in the vicinity of the bottom surface of the surfaced-smoothing metal layer.

EXAMPLES

The present invention is further described with reference to the following examples, but it should be construed that the invention is in no way limited to those examples.

Example 1

A substrate for device bonding having such a structure as is shown in FIG. 1 was prepared in the following manner. FIG. 1 is a sectional view of a typical substrate for device bonding 101 of the present invention. The substrate 200 consists of an aluminum nitride sintered substrate 201, a first undercoating layer 202 containing Ti as a main component, a second undercoating layer 203 containing platinum as a main component and a gold electrode layer 204 laminated in this order. The substrate for device bonding 101 has a structure wherein on a gold electrode layer 204 of the substrate 200, a solder flow-out preventing Pt layer 301, a bonding layer 401 containing Ti as a main component and a solder layer 509 are laminated, wherein the solder layer 509 consists of a first Ag layer 500, a first Au10—Sn layer 501, a Bi layer 502, a second Ag layer 503 and a second Au10—Sn layer 504 laminated in this order.

First, on a surface of an aluminum nitride sintered substrate (50.8 mm×50.8 mm×0.3 mm (thickness), surface roughness (Ra): 0.02 μm, Rmax: 0.179 μm, available from Tokuyama Corporation), the first undercoating layer containing Ti as a main component and having a thickness of 0.06 μm, the second undercoating layer containing platinum as a main component and having a thickness of 0.2 μm, and a gold electrode layer having a thickness of 0.6 μm were laminated in this order by the use of a sputtering apparatus. Subsequently, patterning for preventing flow-out of solder was performed by photolithography, and the Pt layer having a thickness of 0.25 μm was formed by sputtering. Then, solder patterning was performed by photolithography, and on the solder flow-out preventing Pt, the Ti bonding layer having a thickness of 0.06 μm and the Ag layer having a thickness of 1.5 μm were formed by the use of a vacuum deposition apparatus. Subsequently, the Au—Sn layer composed of an Au—Sn alloy (melting point: 217° C., Young's modulus: 45.0 GPa (at 25° C.)) having a gold content of 10% by weight and having a thickness of 1.0 μm was formed by two-element simultaneous deposition using Au and Sn as targets, then the Bi layer having a thickness of 0.33 μm and the Ag layer having a thickness of 0.2 μm were formed, and finally the Au—Sn layer having a gold content of 10% by weight and having a thickness of 2.47 μm was formed by two-element simultaneous deposition using Au and Sn. Thus, a substrate for device bonding (No. 1) of the invention was prepared.

The substrate for device bonding thus obtained was measured on the surface roughness, and as a result, Ra was 0.058 μm and Rmax was 0.689 μm. The measurement of surface roughness was carried out in the following manner using Digital Instruments Contact AFM NanoScope III. That is to say, a double-sided tape was stuck to the opposite side to the solder layer surface side of the substrate for device bonding of the invention, and the substrate for device bonding was fixed to a steel circular plate having a diameter of 12 mm. Then, the circular plate was fixed on an upper part of a piezo-scanner by a magnetic method, and a cantilever equipped with a probe was brought into contact with the solder layer surface. The cantilever responds to protrusions or depressions of the solder layer surface directly and is displaced. The displacement was measured by an "optical lever method". The cantilever used was a V-shaped cantilever made of $Si_3N_4$, having a spring constant of 0.12 N/m, a probe height of 3 μm, a curvature radius of 5 to 40 nm and a ½ cone angle of 35° and having a tip shape of quadrangular pyramid. Prior to the measurement, static elimination using a static elimination blower was carried out to reduce influences by static electricity of the substrate surface to the lowest. The measuring range was a range of 20 μm square, and the number of measuring fields of view was 3 per 1 chip of the substrate for device bonding. After the measurement, image processing of the measured three-dimensional profile was carried out using a softwear of NanoScope III to calculate Ra and Rmax, and a mean value of the 3 fields of view was determined. In the present invention, Ra is a mean value on a surface based on the center plane of the measuring range and is calculated from the formula (1). Rmax is a difference in height between the highest point and the lowest point of the surface.

$$Ra = F(1, L_X L_Y) I(0, L_Y, I(0, L_X | f(x,y) | dx) dy) \quad (1)$$

wherein f(x,y) represents a surface based on the center plane, and $L_X$ and $L_Y$ represent dimensions of the surface.

Subsequently, on the solder layer of the substrate for device bonding prepared as above, a Ga—As semiconductor device having an Au electrode was placed, and the semiconductor device was bonded at 220° C. for 180 seconds by the use of a die bonder to prepare a device bonded substrate. Similarly, 10 device bonded substrates were prepared, and their bond strength was measured by a die shear tester (manufactured by IMADA Inc.). As a result, the mean bond strength was 3.1 kgf/mm², and the modes of peeling were all "inside semiconductor device". The melting point of the solder layer in the examples and the comparative examples was determined by DTA measurement using a Seiko Instruments TG/DTA apparatus SSC-5200.

Further, substrates for device bonding No. 2 to No. 8 of the invention were prepared by changing each thickness of the Bi layer, the Au—Sn layer having a gold content of 10% by weight (Au10—Sn layer) and the Ag layer as shown in Table 1, and then measurements of surface roughness and bond strength were carried out in the same manner as above. The results are set forth in Table 1.

The expression that the mode of peeling is "inside semiconductor device" means that peeling is caused by breakage of a semiconductor device, and the expression that the mode of peeling is "inside solder layer" means that peeling is caused by breakage of a solder layer. Breakage of a semiconductor device takes place at 2.5 kgf/mm² or more. It is generally said that when the mode of peeling is "inside solder layer", the mean bond strength is desired to be 2.0 kgf/mm² or more from the viewpoint of reliability. Further, it can be said that when peeling takes place between a semiconductor device and a solder, bond reliability is low. In the composition of a solder layer in Table 1, a component other than Au, Bi and Ag is Sn, so that the amount (% by weight) of Sn is omitted.

TABLE 1

| | No. | Thickness of first Ag layer (surface-soomthing metal layer) (μm) | Thickness of first Au10-Sn layer (μm) | Thickness of Bi layer (melting point-lowering metal layer) (μm) | Thickness of second Ag layer (surface-soomthing metal layer) (μm) | Thickness of second Au10—Sn layer (μm) | Composition of solder layer (balance is Sn) | | |
|---|---|---|---|---|---|---|---|---|---|
| | | | | | | | Au (wt %) | Bi (wt %) | Ag (wt %) |
| Example 1 | 1 | 1.5 | 1 | 0.33 | 0.2 | 2.47 | 5.61 | 6.71 | 37.13 |
| | 2 | 1.5 | 1 | 0.164 | 0.2 | 2.636 | 5.92 | 3.36 | 37.39 |
| | 3 | 1.5 | 1 | 0.501 | 0.2 | 2.299 | 5.30 | 10.13 | 36.87 |
| | 4 | 1.5 | 1 | 0.675 | 0.2 | 2.125 | 4.98 | 13.55 | 36.60 |
| | 5 | 1.5 | 0.077 | 0.33 | 0.2 | 2.393 | 5.61 | 6.71 | 37.13 |
| | 6 | 1.5 | 1.235 | 0.33 | 0.2 | 1.235 | 5.61 | 6.71 | 37.13 |
| | 7 | 1.5 | 1 | 0.348 | 0.81 | 1.842 | 4.44 | 6.85 | 48.73 |
| | 8 | 0.2 | 1 | 0.33 | 0.2 | 2.47 | 7.39 | 9.38 | 12.20 |
| Example 2 | 9 | 1.5 | 3.47 | 0.33 | 0.2 | — | 5.61 | 6.71 | 37.13 |
| | 10 | 1.5 | 3.636 | 0.164 | 0.2 | — | 5.92 | 3.36 | 37.39 |
| | 11 | 1.5 | 3.299 | 0.501 | 0.2 | — | 5.30 | 10.13 | 36.87 |
| | 12 | 1.5 | 3.125 | 0.675 | 0.2 | — | 4.98 | 13.55 | 36.60 |
| | 13 | 1.5 | 3.13 | 0.34 | 0.4 | — | 5.11 | 6.99 | 41.89 |
| | 14 | 1.5 | 2.842 | 0.348 | 0.81 | — | 4.44 | 6.85 | 48.73 |
| | 15 | 0.2 | 3.47 | 0.33 | 0.2 | — | 7.39 | 9.38 | 12.20 |
| Example 3 | 16 | 1.5 | 3.67 | 0.33 | — | — | 6.00 | 6.80 | 33.14 |
| | 17 | 1.5 | 3.836 | 0.164 | — | — | 6.32 | 3.40 | 33.37 |
| | 18 | 1.5 | 3.508 | 0.492 | — | — | 5.70 | 10.06 | 32.91 |
| | 19 | 1.5 | 3.336 | 0.664 | — | — | 5.38 | 13.48 | 32.68 |
| Comp. Ex. 1 (No. 20) | | 1.5 | 1.735 | 0.33 | 0.2 | 1.735 | 5.61 | 6.71 | 37.13 |

| | No. | Melting point of solder layer (° C.) | Mean bond strength (kgf/mm²) (n = 10) | Main peeling mode* | Ra (μm) | Rmax (μm) |
|---|---|---|---|---|---|---|
| Example 1 | 1 | 180 | 3.1 | inside SC D | 0.058 | 0.689 |
| | 2 | 186 | 2.9 | inside SC D | 0.055 | 0.659 |
| | 3 | 175 | 2.7 | inside SC D | 0.053 | 0.743 |
| | 4 | 168 | 3.3 | inside SC D | 0.058 | 0.721 |
| | 5 | 180 | 2.8 | inside SC D | 0.056 | 0.681 |
| | 6 | 180 | 2.2 | inside SL | 0.057 | 0.711 |
| | 7 | 182 | 2.1 | inside SL | 0.061 | 0.744 |
| | 8 | 181 | 3.2 | inside SC D | 0.052 | 0.672 |
| Example 2 | 9 | 180 | 3.1 | inside SC D | 0.044 | 0.390 |
| | 10 | 186 | 2.8 | inside SC D | 0.047 | 0.516 |
| | 11 | 175 | 2.9 | inside SC D | 0.041 | 0.418 |
| | 12 | 168 | 3 | inside SC D | 0.039 | 0.466 |
| | 13 | 179 | 3.7 | inside SC D | 0.048 | 0.432 |
| | 14 | 185 | 2.3 | inside SL | 0.033 | 0.364 |
| | 15 | 179 | 3.4 | inside SC D | 0.044 | 0.452 |
| Example 3 | 16 | 185 | 3.2 | inside SC D | 0.101 | 0.807 |
| | 17 | 193 | 2.8 | inside SC D | 0.106 | 0.898 |
| | 18 | 182 | 3 | inside SC D | 0.104 | 0.902 |
| | 19 | 176 | 2.9 | inside SC D | 0.107 | 0.986 |
| Comp. Ex. 1 (No. 20) | | 185 | 0.7 | between SCD/SL | 0.120 | 1.060 |

*inside SC D = inside semiconductor device
inside SL = inside solder layer
between SCD/SL = between semiconductor device and solder layer Example 2

A substrate for device bonding was prepared in the same manner as in Example 1, except that the structure of the solder layer 510 was changed to that wherein on the first Ag layer 500 having a thickness of 1.5 μm, a Bi layer 511 having a thickness of 0.33 μm, a second Ag layer 512 having a thickness of 0.2 μm and a first Au10—Sn layer 513 having a thickness of 3.47 μm were laminated in this order, as shown in FIG. 2. Using the substrate for device bonding, a device bonded substrate (No. 9) was prepared at the same bonding temperature as in Example 1. Similarly, 10 device bonded substrates were prepared, and the surface roughness and the bond strength of the device bonded substrates were measured in the same manner as in Example 1. As a result, Ra was 0.044 μm, Rmax was 0.390 μm, the mean bond strength was 3.1 kgf/mm², and the modes of peeling were mainly "inside semiconductor device". Further, substrates for device bonding No. 10 to No. 15 of the invention were prepared by changing each thickness of the Bi layer, the Au10—Sn layer and the Ag layer as shown in Table 1, and then measurement of bond strength was carried out in the same manner as above. The results are set forth in Table 1.

Example 3

A device bonded substrate (No. 16) was prepared in the same manner as in Example 1, except that the structure of the solder layer 520 was changed to that wherein on the first Ag layer 500 having a thickness of 1.5 μm, a Bi layer 521 having a thickness of 0.33 μm and a first Au10—Sn layer 522 having a thickness of 3.67 μm were laminated in this order, as shown in FIG. 3. Similarly, 10 device bonded substrates were prepared, and the surface roughness and the bond strength of the device bonded substrates were measured in the same manner as in Example 1. As a result, Ra was 0.101 μm, Rmax was 0.807 μm, the mean bond strength was 3.2 kgf/mm$^2$, and the modes of peeling were mainly "inside semiconductor device". Further, substrates for device bonding No. 17 to No. 19 of the invention were prepared by changing each thickness of the Bi layer and the Au10—Sn layer as shown in Table 1, and then measurement of bond strength was carried out in the same manner as above. The results are set forth in Table 1.

Example 4

Figure 4:
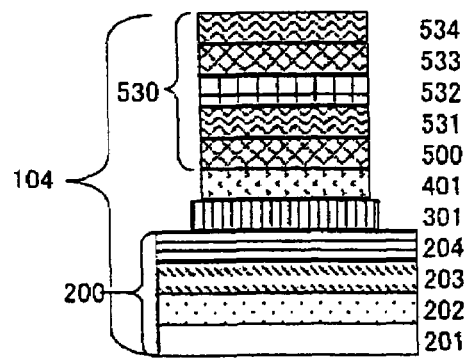
FIG. 4 is a sectional view of a substrate for device bonding of the present invention used in Example 4.

A substrate for device bonding was prepared in the same manner as in Example 1, except that the structure of the solder layer 530 was changed to that wherein on the first Ag layer 500 having a thickness of 1.5 μm, a first Au10—Sn layer 531 having a thickness of 1.0 μm, an In layer 532 having a thickness of 0.33 μm, a second Ag layer 533 having a thickness of 0.2 μm and a second Au10—Sn layer 534 having a thickness of 2.47 μm were laminated in this order, as shown in FIG. 4. Using the substrate for device bonding, a device bonded substrate (No. 21) was prepared at the same bonding temperature as in Example 1. Similarly, 10 device bonded substrates were prepared, and the surface roughness and the bond strength of the device bonded substrates were measured in the same manner as in Example 1. As a result, Ra was 0.049 μm, Rmax was 0.644 μm, the mean bond strength was 2.5 kgf/mm$^2$, and the modes of peeling were mainly "inside semiconductor device". Further, substrates for device bonding No. 22 to No. 28 of the invention were prepared by changing each thickness of the In layer, the Au10—Sn layer and the second Ag layer as shown in Table 2, and then measurement of bond strength was carried out in the same manner as above. The results are set forth in Table 2.

TABLE 2

| | No. | Thickness of first Ag layer (surface-soomthing metal layer) (μm) | Thickness of first Au10-Sn layer (μm) | Thickness of In layer (melting point-lowering metal layer) (μm) | Thickness of second Ag layer (surface-soomthing metal layer) (μm) | Thickness of second Au10—Sn layer (μm) | Composition of solder layer (balance in Sn) Au (wt %) | In (wt %) | Ag (wt %) |
|---|---|---|---|---|---|---|---|---|---|
| Example 4 | 21 | 1.5 | 1 | 0.33 | 0.2 | 2.47 | 5.71 | 5.06 | 37.79 |
| | 22 | 1.5 | 1 | 0.164 | 0.2 | 2.636 | 5.97 | 2.51 | 37.72 |
| | 23 | 1.5 | 1 | 0.501 | 0.2 | 2.299 | 5.44 | 7.70 | 37.86 |
| | 24 | 1.5 | 1 | 0.675 | 0.2 | 2.125 | 5.16 | 10.39 | 37.92 |
| | 25 | 1.5 | 0.077 | 0.33 | 0.2 | 2.393 | 5.71 | 5.06 | 37.79 |
| | 26 | 1.5 | 1.235 | 0.33 | 0.2 | 1.235 | 5.71 | 5.06 | 37.79 |
| | 27 | 1.5 | 1 | 0.348 | 0.81 | 1.842 | 4.52 | 5.16 | 49.62 |
| | 28 | 0.2 | 1 | 0.33 | 0.2 | 2.47 | 8.03 | 7.12 | 12.51 |
| Example 5 | 29 | 1.5 | 3.47 | 0.33 | 0.2 | — | 5.71 | 5.06 | 37.79 |
| | 30 | 1.5 | 3.636 | 0.164 | 0.2 | — | 5.97 | 2.51 | 37.72 |
| | 31 | 1.5 | 3.299 | 0.501 | 0.2 | — | 5.44 | 7.70 | 37.86 |
| | 32 | 1.5 | 3.125 | 0.675 | 0.2 | — | 5.16 | 10.39 | 37.92 |
| | 33 | 1.5 | 3.13 | 0.34 | 0.4 | — | 5.20 | 5.27 | 42.66 |
| | 34 | 1.5 | 2.842 | 0.348 | 0.81 | — | 4.52 | 5.16 | 49.62 |
| | 35 | 0.2 | 3.47 | 0.33 | 0.2 | — | 8.03 | 7.12 | 12.51 |
| Example 6 | 36 | 1.5 | 3.67 | 0.33 | — | — | 6.11 | 5.12 | 33.73 |
| | 37 | 1.5 | 3.836 | 0.164 | — | — | 6.38 | 2.54 | 33.67 |
| | 38 | 1.5 | 3.508 | 0.492 | — | — | 5.85 | 7.65 | 33.79 |
| | 39 | 1.5 | 3.336 | 0.664 | — | — | 5.58 | 10.34 | 33.86 |

| | No. | Melting point of solder layer (° C.) | Mean bond strength (kgf/mm$^2$) (n = 10) | Main peeling mode* | Ra (μm) | Rmax (μm) |
|---|---|---|---|---|---|---|
| Example 4 | 21 | 192 | 2.5 | inside SC D | 0.049 | 0.644 |
| | 22 | 193 | 2.6 | inside SC D | 0.051 | 0.668 |
| | 23 | 184 | 2.2 | inside SC D | 0.055 | 0.752 |
| | 24 | 179 | 2.9 | inside SC D | 0.053 | 0.733 |
| | 25 | 188 | 2.3 | inside SC D | 0.056 | 0.691 |
| | 26 | 191 | 2.1 | inside SL | 0.058 | 0.722 |
| | 27 | 191 | 2.3 | inside SL | 0.063 | 0.765 |
| | 28 | 190 | 2.7 | inside SC D | 0.055 | 0.685 |
| Example 5 | 29 | 189 | 2.7 | inside SC D | 0.035 | 0.370 |
| | 30 | 194 | 3.1 | inside SC D | 0.041 | 0.499 |
| | 31 | 188 | 2.6 | inside SC D | 0.047 | 0.428 |
| | 32 | 180 | 3.2 | inside SC D | 0.044 | 0.488 |
| | 33 | 191 | 2.8 | inside SC D | 0.048 | 0.402 |
| | 34 | 194 | 2.3 | inside SL | 0.035 | 0.388 |
| | 35 | 191 | 2.8 | inside SC D | 0.046 | 0.465 |
| Example 6 | 36 | 197 | 2.7 | inside SC D | 0.105 | 0.854 |
| | 37 | 204 | 2.4 | inside SC D | 0.097 | 0.856 |
| | 38 | 193 | 3.1 | inside SC D | 0.104 | 0.915 |
| | 39 | 188 | 2.9 | inside SC D | 0.103 | 0.992 |

*inside SC D = inside semiconductor device
inside SL = inside solder layer

Example 5

Figure 5:
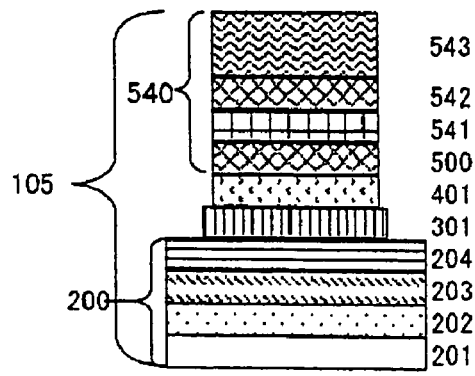
FIG. 5 is a sectional view of a substrate for device bonding of the present invention used in Example 5.

A device bonded substrate (No. 29) was prepared in the same manner as in Example 1, except that the structure of the solder layer 540 was changed to that wherein on the first Ag layer 500 having a thickness of 1.5 μm, an In layer 541 having a thickness of 0.33 μm, a second Ag layer 542 having a thickness of 0.2 μm and a first Au10—Sn layer 543 having a thickness of 3.47 μm were laminated in this order, as shown in FIG. 5. Similarly, 10 device bonded substrates were prepared, and the surface roughness and the bond strength of the device bonded substrates were measured in the same manner as in Example 1. As a result, Ra was 0.035 μm, Rmax was 0.370 μm, the mean bond strength was 2.7 kgf/mm$^2$, and the modes of peeling were mainly "inside semiconductor device". Further, substrates for device bonding No. 30 to No. 35 of the invention were prepared by changing each thickness of the In layer and the Au10—Sn layer as shown in Table 2, and then measurement of bond strength was carried out in the same manner as above. The results are set forth in Table 2.

Example 6

Figure 6:
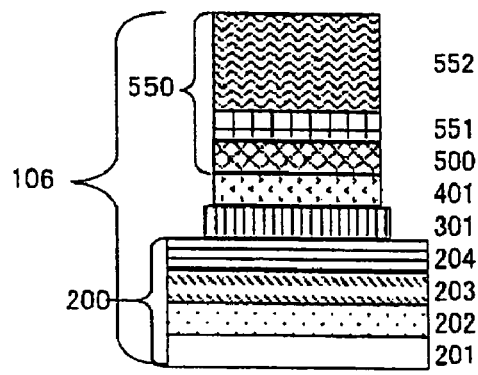
FIG. 6 is a sectional view of a substrate for device bonding of the present invention used in Example 6.

A device bonded substrate (No. 36) was prepared in the same manner as in Example 1, except that the structure of the solder layer 550 was changed to that wherein on the first Ag layer 500 having a thickness of 1.5 μm, an In layer 551 having a thickness of 0.33 μm and a first Au10—Sn layer 552 having a thickness of 3.67 μm were laminated in this order, as shown in FIG. 6. Similarly, 10 device bonded substrates were prepared, and the surface roughness and the bond strength of the device bonded substrates were measured in the same manner as in Example 1. As a result, Ra was 0.105 μm, Rmax was 0.854 μm, the mean bond strength was 2.7 kgf/mm$^2$, and the modes of peeling were mainly "inside semiconductor device". Further, substrates for device bonding No. 37 to No. 39 of the invention were prepared by changing each thickness of the In layer and the Au10—Sn layer as shown in Table 2, and then measurement of bond strength was carried out in the same manner as above. The results are set forth in Table 2.

Example 7

Figure 7:
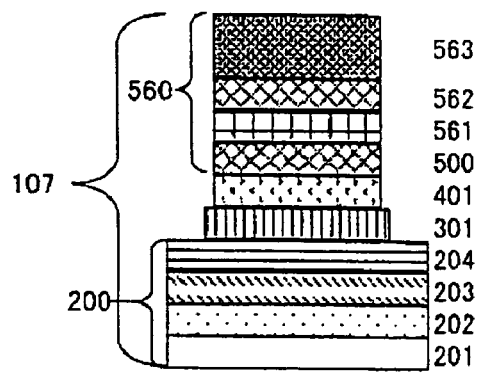
FIG. 7 is a sectional view of a substrate for device bonding of the present invention used in Example 7.

A device bonded substrate (No. 40) was prepared in the same manner as in Example 1, except that the structure of the solder layer 560 was changed to that wherein on the first Ag layer 500 having a thickness of 1.5 μm, a Bi layer 561 having a thickness of 0.33 μm, a second Ag layer 562 having a thickness of 0.2 μm and a first Sn layer 563 having a thickness of 3.47 μm were laminated in this order, as shown in FIG. 7. Similarly, 10 device bonded substrates were prepared, and the surface roughness and the bond strength of the device bonded substrates were measured in the same manner as in Example 1. As a result, Ra was 0.044 μm, Rmax was 0.410 μm, the mean bond strength was 2.5 kgf/mm$^2$, and the modes of peeling were mainly "inside semiconductor device". Further, substrates for device bonding No. 41 to No. 43 of the invention were prepared by changing each thickness of the Bi layer and the Sn layer as shown in Table 3, and then measurement of bond strength was carried out in the same manner as above. The results are set forth in Table 3.

TABLE 3

| | No. | Thickness of first Ag layer (surface-soomthing metal layer) (μm) | Thickness of Bi layer (melting point-lowering metal layer) (μm) | Thickness of second Ag layer (surface-soomthing metal layer) (μm) | Thickness of first Sn layer (μm) | Composition of solder layer (balance is Sn) Bi (wt %) | Composition of solder layer (balance is Sn) Ag (wt %) | Melting point of solder layer (° C.) | Mean bond strength (kgf/mm$^2$) (n = 10) | Main peeling mode* | Ra (μm) | Rmax (μm) |
|---|---|---|---|---|---|---|---|---|---|---|---|---|
| Example 7 | 40 | 1.5 | 0.33 | 0.2 | 3.47 | 6.96 | 38.47 | 196 | 2.5 | inside SC D | 0.044 | 0.410 |
| | 41 | 0.2 | 0.33 | 0.2 | 3.27 | 10.32 | 13.42 | 193 | 2.8 | inside SC D | 0.039 | 0.521 |
| | 42 | 0.2 | 0.164 | 0.2 | 3.436 | 5.20 | 13.60 | 199 | 2.9 | inside SC D | 0.048 | 0.433 |
| | 43 | 0.2 | 0.501 | 0.2 | 3.099 | 15.46 | 13.24 | 178 | 2.7 | inside SC D | 0.043 | 0.458 |

| | No. | Thickness of first Ag layer (surface-soomthing metal layer) (μm) | Thickness of In layer (melting point-lowering metal layer) (μm) | Thickness of second Ag layer (surface-soomthing metal layer) (μm) | Thickness of first Sn layer (μm) | Composition of solder layer (balance is Sn) In (wt %) | Composition of solder layer (balance is Sn) Ag (wt %) | Melting point of solder layer (° C.) | Mean bond strength (kgf/mm$^2$) (n = 10) | Main peeling mode* | Ra (μm) | Rmax (μm) |
|---|---|---|---|---|---|---|---|---|---|---|---|---|
| Example 8 | 44 | 1.5 | 0.33 | 0.2 | 3.47 | 5.25 | 39.18 | 207 | 3.1 | inside SC D | 0.046 | 0.512 |
| | 45 | 0.2 | 0.33 | 0.2 | 3.27 | 7.85 | 13.79 | 202 | 2.5 | inside SC D | 0.049 | 0.484 |
| | 46 | 0.2 | 0.164 | 0.2 | 3.436 | 3.90 | 13.79 | 211 | 2.3 | inside SL | 0.041 | 0.511 |
| | 47 | 0.2 | 0.501 | 0.2 | 3.099 | 11.93 | 13.80 | 185 | 2.1 | inside SL | 0.047 | 0.498 |

*inside SC D = inside semiconductor device
inside SL = inside solder layer

Example 8

Figure 8:
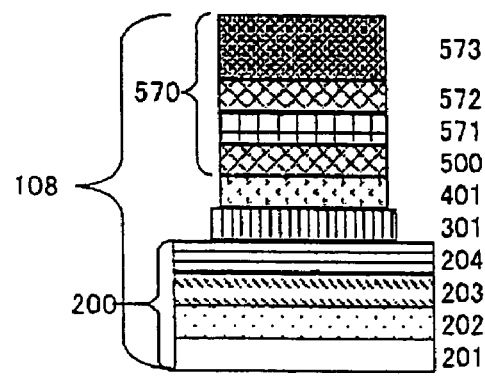
FIG. 8 is a sectional view of a substrate for device bonding of the present invention used in Example 8.

A device bonded substrate (No. 44) was prepared in the same manner as in Example 1, except that the structure of the solder layer 570 was changed to that wherein on the first Ag layer 500 having a thickness of 1.5 μm, an In layer 571 having a thickness of 0.33 μm, a second Ag layer 572 having a thickness of 0.2 μm and a first Sn layer 573 having a thickness of 3.47 μm were laminated in this order, as shown in FIG. 8. Similarly, 10 device bonded substrates were prepared, and the surface roughness and the bond strength of the device bonded substrates were measured in the same manner as in Example 1. As a result, Ra was 0.046 μm, Rmax was 0.512 μm, the mean bond strength was 3.1 kgf/mm², and the modes of peeling were mainly "inside semiconductor device". Further, substrates for device bonding No. 44 to No. 47 of the invention were prepared by changing each thickness of the In layer and the Sn layer as shown in Table 3, and then measurement of bond strength was carried out in the same manner as above. The results are set forth in Table 3.

Comparative Example 1

Figure 9:
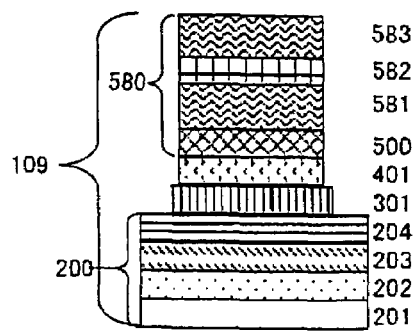
FIG. 9 is a sectional view of a substrate for device bonding used in Comparative Example 1.

A substrate for device bonding (No. 20) was prepared in the same manner as in Example 1, except that the structure of the solder layer 580 was changed to that wherein on the first Ag layer 500 having a thickness of 1.5 μm, a first Au10—Sn layer 581 having a thickness of 1.735 μm, a Bi layer 582 having a thickness of 0.33 μm and a second Au10—Sn layer 583 having a thickness of 1.735 μm were laminated in this order, as shown in FIG. 9. Using the substrate for device bonding, a device bonded substrate was prepared under the same bonding temperature and bonding conditions as in Example 1. Similarly, 10 device bonded substrates were prepared, and the surface roughness and the bond strength of the device bonded substrates were measured in the same manner as in Example 1. As a result, Ra was 0.120 μm, Rmax was 1.06 μm, the mean bond strength was 0.7 kgf/mm², and the modes of peeling were all "between semiconductor device and solder".

Comparative Example 2

Figure 10:
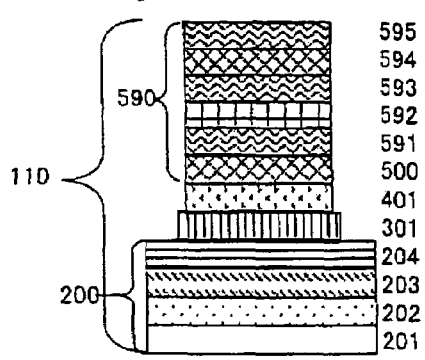
FIG. 10 is a sectional view of a substrate for device bonding used in Comparative Example 2.

A substrate for device bonding was prepared in the same manner as in Example 1, except that the structure of the solder layer 590 was changed to that wherein on the first Ag layer 500 having a thickness of 1.5 μm, a first Au10—Sn layer 591 having a thickness of 1.156 μm, a Bi layer 592 having a thickness of 0.33 μm, a second Au10—Sn layer 593 having a thickness of 1.156 μm, a second Ag layer 594 having a thickness of 0.2 μm and a third Au10—Sn layer 595 having a thickness of 1.156 μm were laminated in this order, as shown in FIG. 10. Using the substrate for device bonding, a device bonded substrate was prepared under the same bonding temperature and bonding conditions as in Example 1. Similarly, 10 device bonded substrates were prepared, and the surface roughness and the bond strength of the device bonded substrates were measured in the same manner as in Example 1. As a result, Ra was 0.119 μm, Rmax was 0.972 μm, the mean bond strength was 0.8 kgf/mm², and the modes of peeling were all "between semiconductor device and solder".

Comparative Example 3

Figure 11:
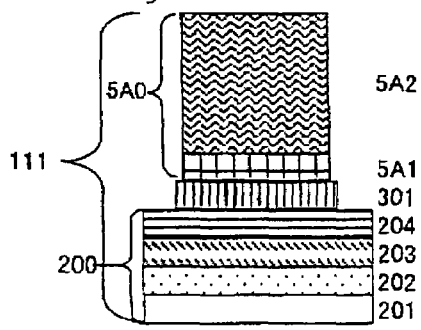
FIG. 11 is a sectional view of a substrate for device bonding used in Comparative Example 3.

A device bonded substrate was prepared in the same manner as in Example 1, except that the first Ag layer was not formed and the structure of the solder layer 5A0 was changed to that wherein a Bi layer 5A1 having a thickness of 0.33 μm and a first Au10—Sn layer 5A2 having a thickness of 3.67 μm were laminated in this order from the solder flow-out preventing Pt side, as shown in FIG. 11. Similarly, 10 device bonded substrates were prepared, and the surface roughness and the bond strength of the device bonded substrates were measured in the same manner as in Example 1. As a result, Ra was 0.131 μm, Rmax was 1.272 μm, the mean bond strength was 0.4 kgf/mm², and the modes of peeling were all "between semiconductor device and solder".

Reference Example 1

Figure 12:
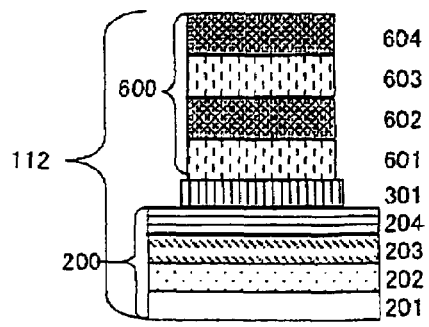
FIG. 12 is a sectional view of a conventional substrate for device bonding with a Sn—Pb solder used in Reference Example 1.
Figure 13:
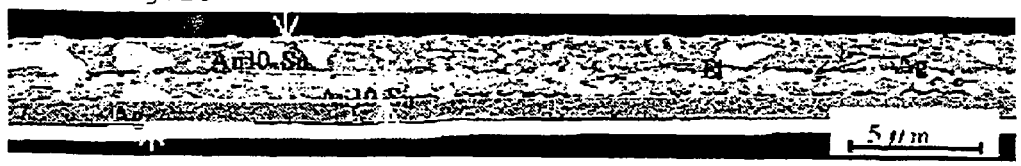
FIG. 13 is a photograph of a polished section of a substrate for device bonding used in Example 1.
Figure 14:
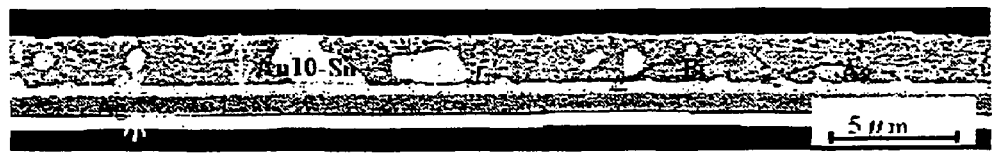
FIG. 14 is a photograph of a polished section of a substrate for device bonding used in Example 2.
Figure 15:
FIG. 15 is a photograph of a polished section of a substrate for device bonding used in Example 3.
Figure 16:
FIG. 16 is a photograph of a polished section of a substrate for device bonding used in Comparative Example 1.
Figure 17:
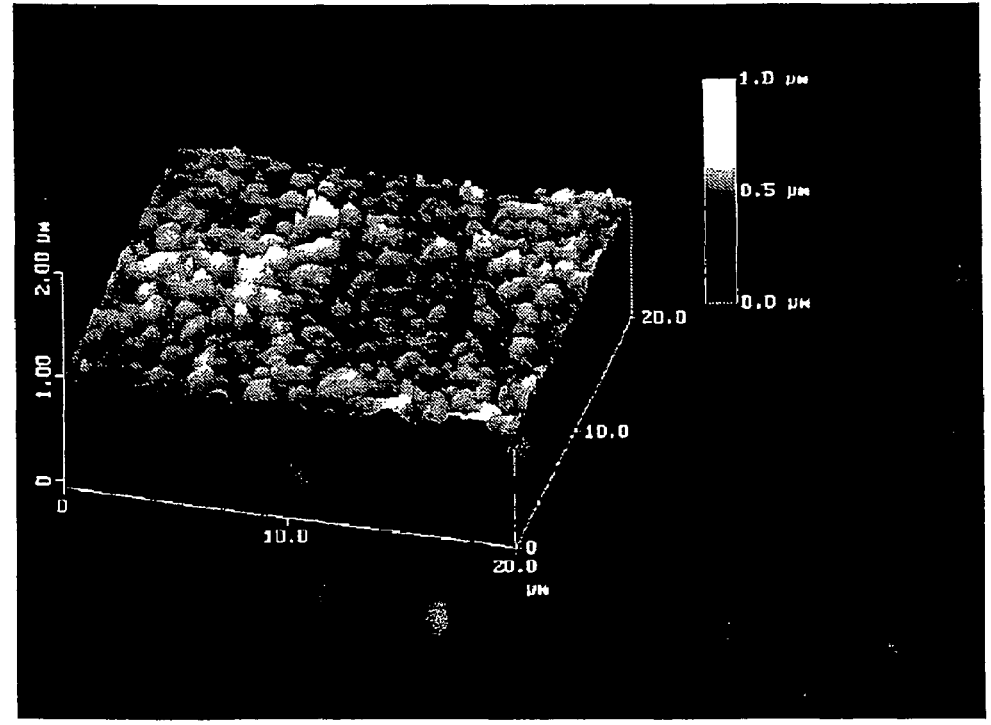
FIG. 17 is a three-dimensional image obtained by measuring a solder layer surface of a substrate for device bonding used in Example 1 by means of AFM.
Figure 18:
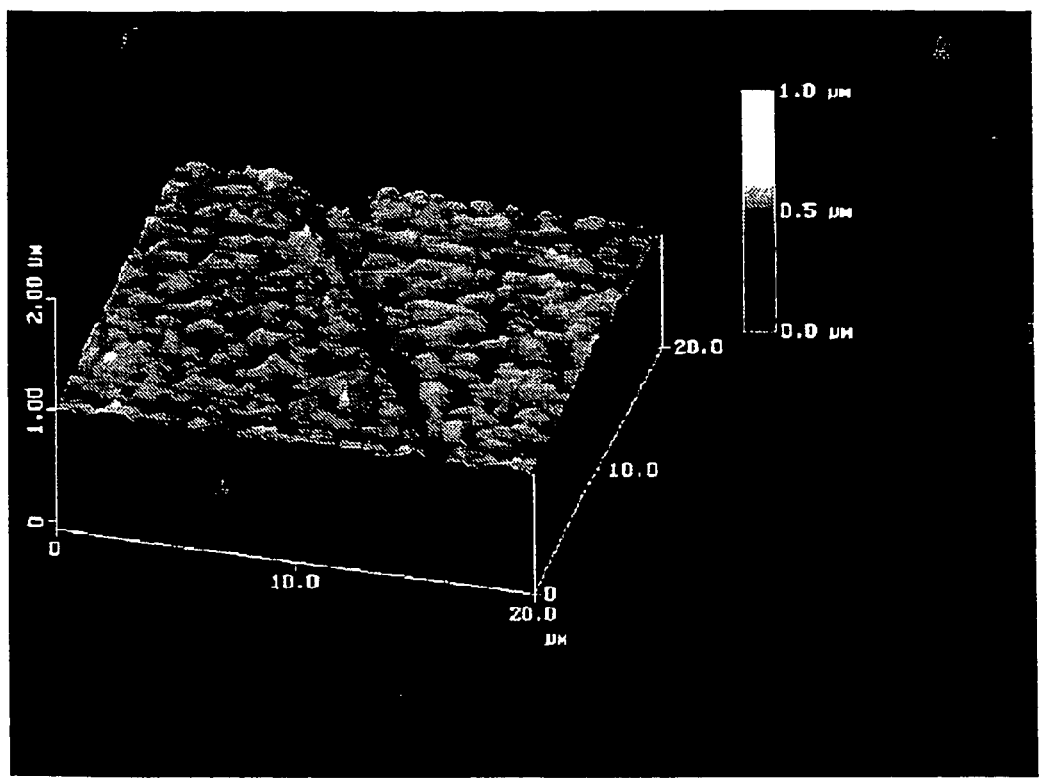
FIG. 18 is a three-dimensional image obtained by measuring a solder layer surface of a substrate for device bonding used in Example 2 by means of AFM.
Figure 19:
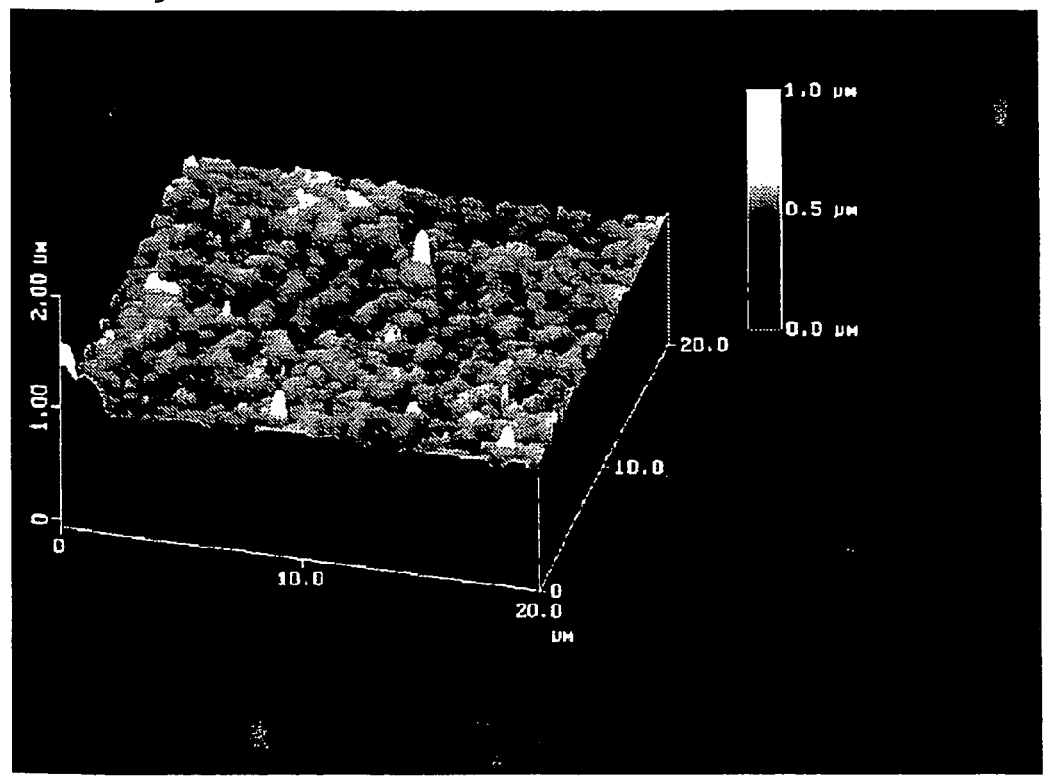
FIG. 19 is a three-dimensional image obtained by measuring a solder layer surface of a substrate for device bonding used in Example 3 by means of AFM.
Figure 20:
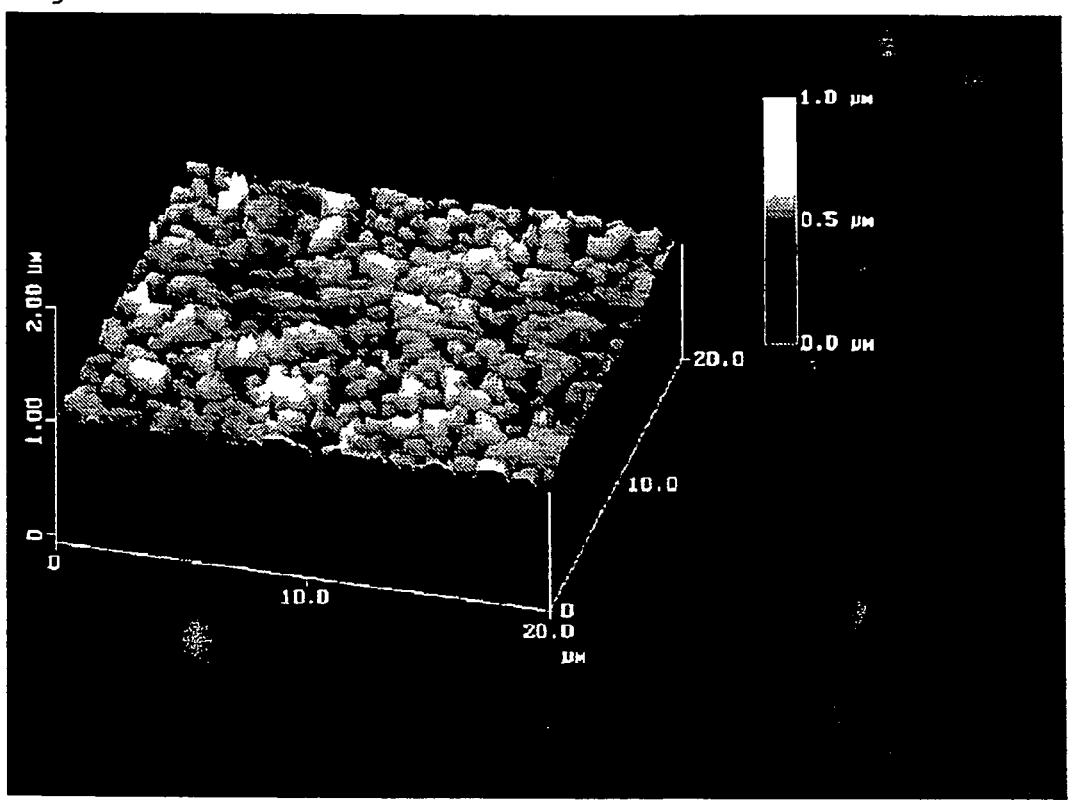
FIG. 20 is a three-dimensional image obtained by measuring a solder layer surface of a substrate for device bonding used in Comparative Example 1 by means of AFM.

A substrate for device bonding was prepared in the same manner as in Example 1, except that the first Ag layer was not formed and, as the solder layer, a Sn—Pb solder layer 600 shown in FIG. 12, i.e., a layer having a structure consisting of a first Pb layer 601 having a thickness of 0.55 μm, a first Sn layer 602 having a thickness of 1.45 μm, a second Pb layer 603 having a thickness of 0.55 μm and a second Sn layer 604 having a thickness of 1.45 μm laminated in this order from the solder flow-out preventing Pt side, was formed. Using the substrate for device bonding, a device bonded substrate was prepared at the same bonding temperature as in Example 1. Similarly, 10 device bonded substrates were prepared, and the bond strength of the device bonded substrates was measured in the same manner as in Example 1. As a result, the mean bond strength was 3.4 kgf/mm², and the modes of peeling were mainly "inside semiconductor device".

In FIGS. 13 to 16, photographs of polished sections of the substrates for device bonding prepared in Examples 1 to 3 and Comparative Example 1 are shown, respectively, and in FIGS. 17 to 20, three-dimensional images of the solder layer surfaces of these substrates obtained in the measurement of surface roughness are shown, respectively.

The invention claimed is:

1. A substrate for device bonding, comprising an electrode layer and a solder layer formed on the electrode layer, wherein the solder layer is a Pb-free solder layer comprising:
   (1) a base metal layer comprising (i) Sn, (ii) Sn and Au, or (iii) In,
   (2) one or more melting point-lowering metal layers each of which comprises at least one metal selected from the group consisting of Bi, In (only in the case where the base metal is Sn, or Sn and Au), Zn, Au (only in the case where the base metal is In) and Sb, and
   (3) one or more surface-smoothing metal layers each of which comprises at least one metal selected from the group consisting of Ag, Ni, Fe, Al, Cu and Pt, and
   each of the melting point-lowering metal layers is adjacent to any one of the surface-smoothing metal layers.

2. A process for producing a device bonded substrate, comprising placing a device having an electrode on the solder layer of the substrate for device bonding of claim 1 in such a manner that the electrode of the device is brought into contact with the solder layer and then bonding the device by reflow soldering.

3. A process for producing a substrate for device bonding, comprising a solder layer-forming step for forming a Pb-free solder layer on an electrode layer of the substrate, said Pb-free solder layer comprising:
   (1) a base metal comprising (i) Sn, (ii) Sn and Au, or (iii) In,
   (2) at least one metal selected from the group consisting of Bi, In (only in the case where the base metal is Sn, or Sn and Au), Zn, Au (only in the case where the base metal is In) and Sb, and
   (3) at least one metal selected from the group consisting of Ag, Ni, Fe, Al, Cu and Pt,
   said Pb-free solder layer having a thickness of 1 to 15 μm and a surface roughness (Ra) of not more than 0.11 μm,
   wherein the solder layer-forming step includes one or more steps for forming a layer comprising the base metal, one or more steps for forming a melting point-lowering metal layer comprising at least one metal selected from the group consisting of Bi, In (only in the case where the base metal is Sn, or Sn and Au), Zn, Au (only in the case where the base metal is In) and Sb, and one or more steps for forming a surface-smoothing metal layer comprising at least one metal selected from the group consisting of Ag, Ni, Fe, Al, Cu and Pt, and immediately before and/or immediately after the step for forming the melting point-lowering metal layer, any one of the steps for forming the surface-smoothing metal layer is carried out.

4. The process of claim 3, wherein each of the melting point-lowering metal layers is adjacent to any one of the surface-smoothing metal layers.

5. A process for producing a substrate for device bonding, comprising a bonding layer-forming step for forming a bonding layer comprising a transition metal on an electrode layer and a solder layer-forming step for forming a Pb-free solder layer on the bonding layer, said Pb-free solder layer comprising:

(1) a base metal comprising (i) Sn, (ii) Sn and Au, or (iii) In,
(2) at least one metal selected from the group consisting of Bi, In (only in the case where the base metal is Sn, or Sn and Au), Zn, Au (only in the case where the base metal is In) and Sb, and
(3) at least one metal selected from the group consisting of Ag, Ni, Fe, Al, Cu and Pt, said Pb-free solder layer having a thickness of 1 to 15 μm and a surface roughness (Ra) of not more than 0.11 μm,
wherein the solder layer-forming step includes one or more steps for forming a layer comprising the base metal, one or more steps for forming a melting point-lowering metal layer comprising at least one metal selected from the group consisting of Bi, In (only in the case where the base metal is Sn, or Sn and Au), Zn, Au (only in the case where the base metal is In) and Sb, and one or more steps for forming a surface-smoothing metal layer comprising at least one metal selected from the group consisting of Ag, Ni, Fe, Al, Cu and Pt, and
immediately before and/or immediately after the step for forming the melting point-lowering metal layer, any one of the steps for forming the surface-smoothing metal layer is carried out.

6. The process of claim 5, wherein each of the melting point-lowering metal layers is adjacent to any one of the surface-smoothing metal layers.

* * * * *

UNITED STATES PATENT AND TRADEMARK OFFICE
CERTIFICATE OF CORRECTION

| | |
|---|---|
| PATENT NO. | : 7,459,794 B2 |
| APPLICATION NO. | : 10/569358 |
| DATED | : December 2, 2008 |
| INVENTOR(S) | : Yokoyama et al. |

Page 1 of 1

It is certified that error appears in the above-identified patent and that said Letters Patent is hereby corrected as shown below:

Column 9, Line 16, "becomes feasible" should read -- becomes unfeasible --

Signed and Sealed this

Seventh Day of April, 2009

JOHN DOLL
*Acting Director of the United States Patent and Trademark Office*